(12) United States Patent
Becker

(10) Patent No.: US 9,225,327 B2
(45) Date of Patent: Dec. 29, 2015

(54) BURST DETECTION FOR LINES TO REMOTE DEVICES

(71) Applicant: Infineon Technologies Austria AG, Villach (AT)

(72) Inventor: Burkhard Becker, Ismaning (DE)

(73) Assignee: Infineon Technologies Austria AG, Villach (AT)

( * ) Notice: Subject to any disclaimer, the term of this patent is extended or adjusted under 35 U.S.C. 154(b) by 209 days.

(21) Appl. No.: 13/922,846

(22) Filed: Jun. 20, 2013

(65) Prior Publication Data

US 2014/0375330 A1    Dec. 25, 2014

(51) Int. Cl.
*G01R 31/04* (2006.01)
*H03K 17/16* (2006.01)
*H04L 29/08* (2006.01)
*G08C 19/28* (2006.01)
*G01R 31/00* (2006.01)

(52) U.S. Cl.
CPC .............. *H03K 17/162* (2013.01); *G08C 19/28* (2013.01); *H04L 67/125* (2013.01); *G01R 31/001* (2013.01)

(58) Field of Classification Search
None
See application file for complete search history.

(56) References Cited

U.S. PATENT DOCUMENTS

| 4,389,694 A * | 6/1983 | Cornwell, Jr. ................. 361/48 |
| 2011/0006824 A1* | 1/2011 | Kang et al. ..................... 327/175 |
| 2014/0268430 A1* | 9/2014 | Bourgeau ......................... 361/20 |

FOREIGN PATENT DOCUMENTS

DE    10 2004 062 205 A1    7/2006

* cited by examiner

*Primary Examiner* — Minh N Tang
(74) *Attorney, Agent, or Firm* — Slater & Matsil, L.L.P.

(57) ABSTRACT

In some implementations, a control device is coupled with an output, the output to be coupled with a remote device via a line, for example, in an industrial environment. A burst detector is coupled with the output to detect bursts on the line. In response to detected bursts, a switch device may couple the output with a reference potential.

22 Claims, 5 Drawing Sheets

BURST DETECTION FOR LINES TO REMOTE DEVICES

TECHNICAL FIELD

The present application relates to apparatuses and methods involving burst detection on a line to a remote device.

BACKGROUND

In industrial applications, control devices are used to control various remote devices. For example, control devices comprising one or more power switches may be used to supply power to load like, for example, electric motors.

In such cases, the control devices and the remote devices may be coupled via comparatively long lines, for example, up to 100 meters or more. In industrial environments, electromagnetic interference from various apparatuses or devices may cause voltage bursts on the lines, which may adversely affect operation of the control devices, for example, may cause a transistor used, for example, as a power switch to close, i.e., become conductive although it should be in an inactive, i.e., open, state. This may happen in particular in case a load on the line is disconnected, for example, due to a broken connection. This in turn may lead to a voltage building up on the line which may have undesired effects, e.g., may cause a diagnostic circuit coupled to the line to output a wrong value, for example, indicating a short circuit to a supply voltage instead of a disconnected load.

DETAILED DESCRIPTION OF ILLUSTRATIVE EMBODIMENTS

In the following, various embodiments will be described referring to the attached drawings. It should be noted that these embodiments serve illustrative purposes only and are not to be construed as limiting the scope of the present application. For example, features from different embodiments may be combined to form further embodiments. On the other hand, while embodiments are described as comprising a plurality of elements, in other embodiments, some of the depicted elements may be omitted, alternative elements may be provided and/or additional elements may be provided.

Some embodiments relate to burst detection on a line coupling a control device with a remote device. A control device generally is a device controlling a voltage and/or a current on the line. For example, a control device may comprise one or more power switches to switch a voltage on the line on and off. In this way, the remote device may switchably be supplied with power, and/or by switching a voltage on and off corresponding signals may be transmitted to the remote device.

The term "remote device" generally indicates a distance between the control device and the remote device. For example, the control device and the remote device may be provided in different housings. A distance between control device and remote device may, for example, be at least 1 meter, at least 10 meters or even about 100 meters or more, although shorter or longer distances may be used as well.

Some embodiments relate to single-ended connections between a control device and a remote device, i.e., for a specific kind of signal a single line is provided between a control device or a remote device. For example, on this line a signal level with respect to ground may be transmitted. It should be noted that in case different kinds of signals, for example, control signals for different functions, are transmitted, a corresponding plurality of lines may be provided.

Devices as described above may in particular be used in industrial environments.

Figure 1:
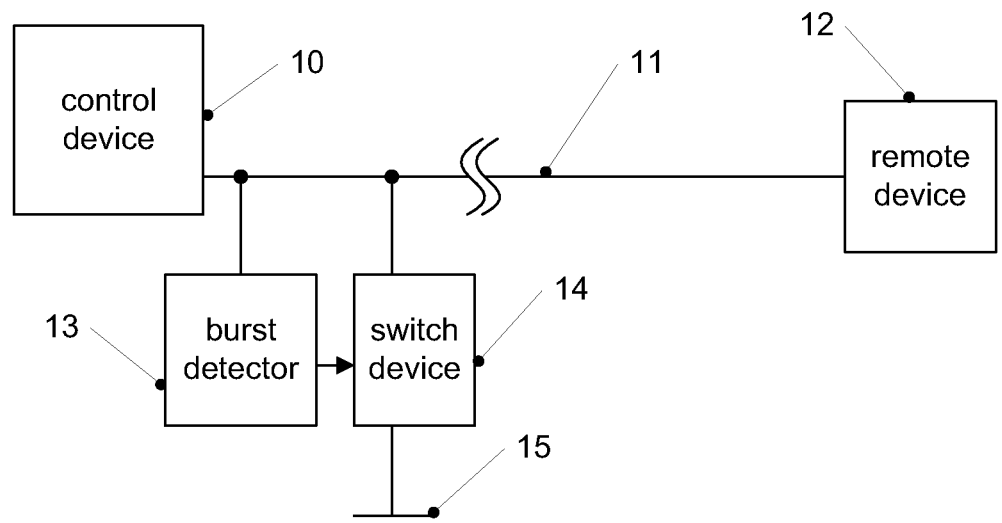
FIG. 1 is a block diagram of a system including an apparatus according to an embodiment.

Turning now to the figures, in FIG. 1 a block diagram illustrating an embodiment is shown. In the embodiment of FIG. 1, a control device is coupled via a line 11 with a remote device 12. Remote device 12 may be part of any industrial appliance, for example, comprise a motor or a relay, and constitutes a load on line 11. Typical load resistances constituted by remote device 12 may be in a range from about 40Ω to about 15Ω, although other values may be used as well.

Line 11 may, for example, comprise a cable of a length of 1 meter or more, 10 meters or more or even up to 100 meters or more.

In an industrial environment, various machines, devices, apparatuses etc. may couple electromagnetic disturbances into cable 11. One kind of these disturbances is referred to as bursts. Such bursts may have voltages up to some thousand volts, for example, about ±4000 V, a rise time in the order of 10 ns and a decay time of the order of 85 ns, although other values are equally possible. Such burst pulses may be repetitive, for example, with a frequency in a range between 5 kHz and 100 kHz, although other repetition rates or single pulses are also possible.

Burst pulses may cause a malfunctioning of control device 10. For example, in embodiments where control device 10 comprises a power transistor like a PMOS transistor, as will be explained later in greater detail with respect to FIG. 3, the PMOS transistor may be inadvertently closed for brief periods of time although it is nominally open, i.e., intended to be open, which may lead to an undesired voltage rise on line 11. This may, in particular, happen in cases where remote device 12 is decoupled from line 11 for some reason, for example, due to a cable break, a malfunctioning of remote device 12 or otherwise disconnecting remote device 12. Such a rise of voltage on line 11 in turn may have undesired impacts on other devices, for example, diagnostic devices.

Generally, in the present application a closed state of a transistor (or switch) refers to a state where the transistor is conducting between its source and drain terminals (or other load terminals), i.e., provides a low ohmic connection between its source and drain terminals (or other load terminals), while an open state refers to a state where the transistor (or switch) is non-conducting between its source and drain terminals (or other load terminals), i.e., provides a high ohmic connection between source and drain terminals (or other load terminals).

In the embodiment of FIG. 1, a burst detector 13 is provided to detect bursts on line 11. In case a burst is detected by burst detector 13, burst detector 13 controls a switch device 14 to close a path between line 11 and a reference potential 15, for example, ground. This in some embodiments may partially or fully compensate adverse effects caused by the bursts. For example, a rise of voltage as described above may be fully or partially prevented.

In the embodiment of FIG. 1, control device 10, burst detector 13 and switch device 14 may be implemented in a single apparatus, for example, implemented on a single chip, or implemented in a single housing.

Figure 2:
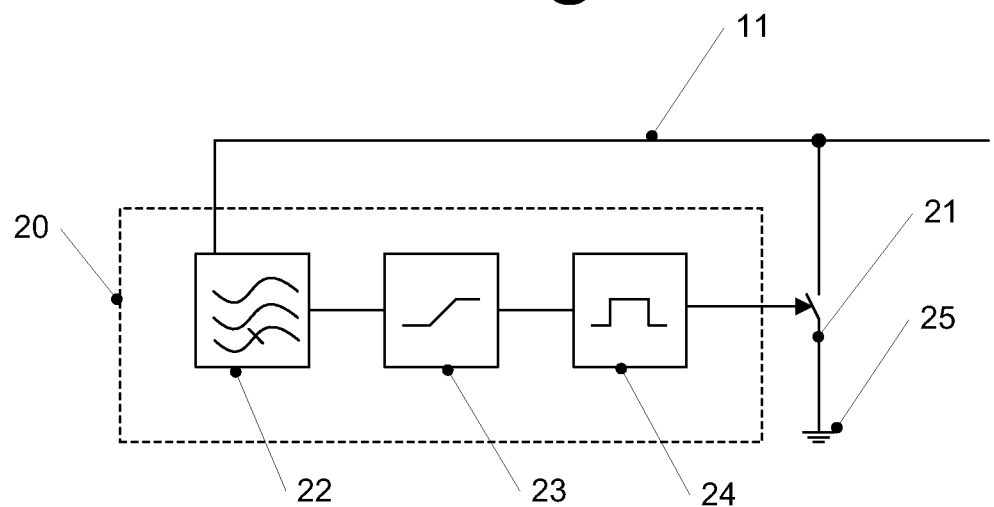
FIG. 2 is a block diagram of a burst detector according to an embodiment.

In FIG. 2, a block diagram of a burst detector 20 according to an embodiment is shown. Burst detector 20 is an example for an implementation of burst detector 13 of FIG. 1, although burst detector 13 may also be implemented in other ways.

Burst detector 20 is coupled to line 11 coupling a control device like control device 10 of FIG. 1 with a remote device like remote device 12 of FIG. 1.

Burst detector 20 comprises a high-pass filter 22 which receives signals from line 11 and serves to filter out signals which do not relate to bursts. As explained above, burst pulses may have typical rise times, decay times and/or repetition frequencies, and a corner frequency of high-pass filter 22 may be selected corresponding to such burst properties. High-pass filter 22 may be designed to match burst pulses for a specific environment, a specific application or other specific requirements such that the burst pulses pass high-pass filter 22, whereas other signals on line 11, for example, signals with lower frequencies, slower rise times and/or slower decay times are blocked by high-pass filter 22.

The thus filtered signal is limited by a limiter 23 to limit a current flowing via burst detector 20 and/or a voltage present in burst detector 20. Based on the limited signal, a signal generator 24 generates a signal closing a switch 21 such that effects of the burst pulse may be at least partially compensating, e.g., by pulling a voltage on line 11 towards ground 25. Switch 21 is an example for switch device 14 of FIG. 1.

Figure 3:
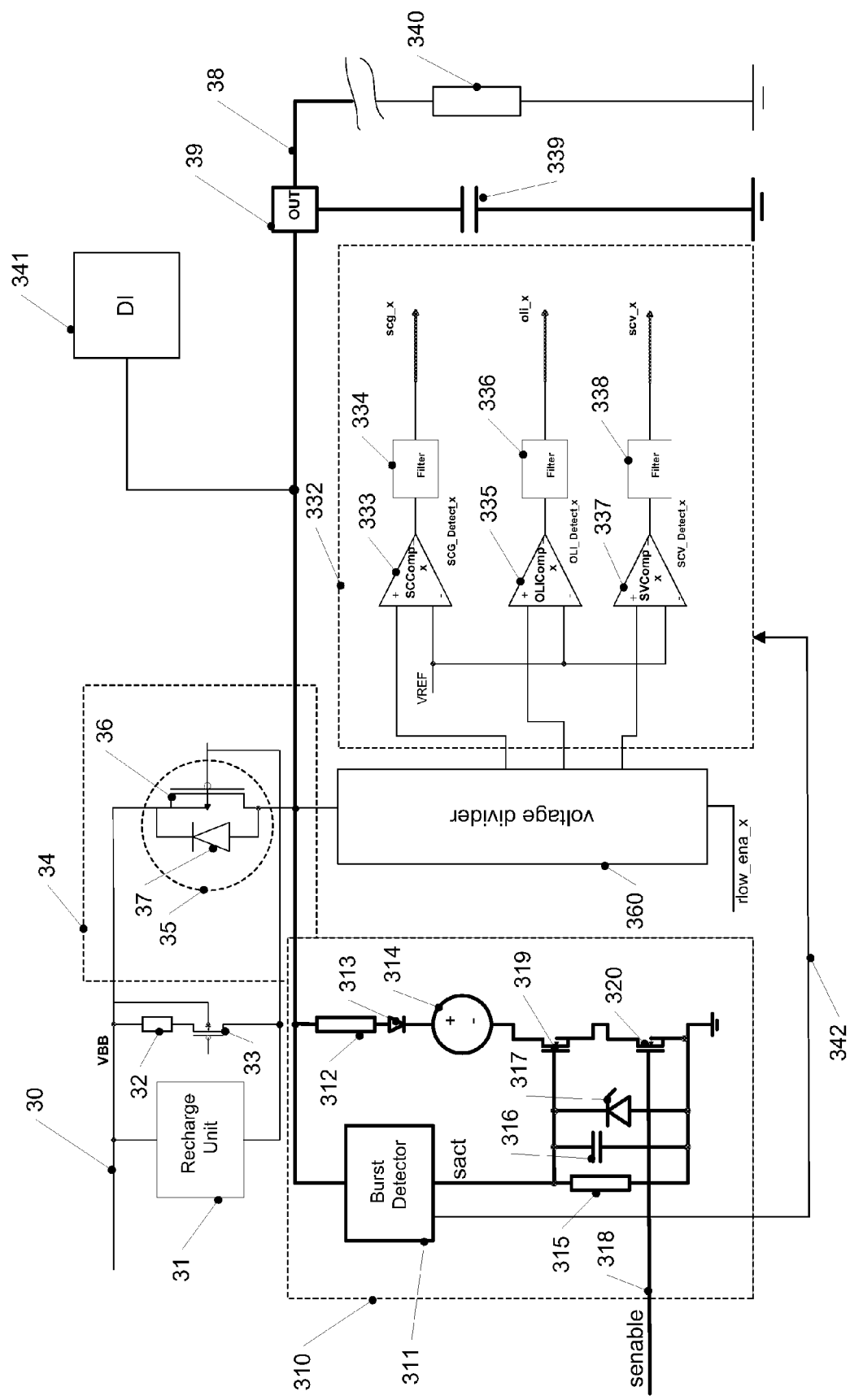
FIG. 3 is a circuit diagram illustrating an apparatus according to an embodiment.

In FIG. 3, an apparatus according to a further embodiment is shown. In the embodiment of FIG. 3, a remote device symbolized by a load 340 is coupled with an output 39 of a control device 34. The control device comprises a power transistor device 35 with a PMOS power transistor 36 and a diode 37. Power transistor device 35 may be one of a plurality of power switches of control device 34. Control device 34 may comprise further power switches (not shown) for example, to control different loads, devices or appliances. Power transistor device 35 selectively couples a supply voltage 30, for example a voltage VBB which may be a battery voltage of, for example, about 24 V with output 39. Load 340 is coupled with output 39 via a line 38 and is additionally coupled to ground. Load 340 may, for example, be a motor or a relay controlled by power switch device 35. By activating and deactivating PMOS power transistor 36, supply voltage 30 is selectively coupled with output 39 and thus with load 340 via line 38. Therefore, power transistor 36 may serve as a power switch for load 34, or by being controlled with a modulated signal may be used to send signals to load 340.

Furthermore, a capacitor 339 is coupled with output 39 on the one hand and ground. In some applications, a transistor like capacitor 339, which may have a capacitance value of about 10 nF, is required or desirable for removing or filtering high frequency disturbances, e.g., with frequencies higher than 1-2 MHz.

As already explained for line 11 of FIGS. 1 and 2, line 38 may, for example, be a cable at least 1 meter long, at least 10 meters long or even about 100 meters long or more. However, longer or shorter lengths may be employed as well, and burst pulses may occur on cables of any length.

As explained above, burst pulses may occur on line 38. Such burst pulses, in particular negative burst pulses, may couple on a gate terminal of PMOS transistor 36 via an inherent drain-gate capacitor, causing PMOS transistor 36 to become conductive between its drain and source terminals, i.e., closed, for a brief period of time even when PMOS transistor 36 is nominally open, i.e., nominally non-conducting between source and drain. The term "nominally" as used herein refers to an intended state. Due to undesired effects, e.g., due to burst pulses, the actual state may differ from the nominal state as described above. This in turn may cause capacitance 339 to be charged. In a case where load 340 is decoupled from line 38 deliberately or accidentally, when repetitive bursts occur the charging of capacitance 339 increases, leading to an increasing voltage on line 38. This may, for example, lead to a malfunctioning of a diagnostic circuit 332 which will be described below, and/or to other undesired effects. With a corresponding repetition rate of burst pulses, such a charging of capacitance 339 may in particular be faster than a discharging of capacitance 339 to ground, leading to a gradual building of the voltage on line 38.

Diagnostic circuit 332 is coupled with output 39 and thus with line 38 via a voltage divider 360. Furthermore, a signal rlow_ena_x may be used to activate and deactivate diagnostic unit 332. In some embodiments, the diagnostic circuit 332 may be activated using signals rlow_ena_x when PMOS switch device 35 is open, decoupling voltage 30 from output 39. With voltage divider 360 (e.g., a resistive voltage divider) in the embodiment shown three different voltages are supplied to comparators 333, 335 and 337 of diagnostic circuit 332 as shown. These three different voltages are compared with a reference voltage VREF in comparators 333, 335 and 337. The results of these comparisons are filtered by filters 334, 336 and 338 as shown to form output signals scg_x, oli_x and scv_x.

By the voltage divider 360 these three signals indicate different voltage levels on output 39 and therefore on line 38.

Just to give a numerical example, signals scv_x may, for example, indicate that a voltage at output 39 is above a first threshold, for example, 9 V or more, which may indicate, for example, a short circuit between voltage 30 and output 39. Signal oli_x may indicate a voltage above a second threshold smaller than the first threshold, for example, 7 V which may, for example, indicate a load decoupled from output 39, for example, due to a cable break or the like. Signal scg_x may indicate a voltage above a third threshold smaller than the second threshold, which may indicate still another failure like a short circuit to ground.

In a case like the one described above where a voltage on line 38 is building up due to burst pulses when load 340 is disconnected, the voltage may raise above the first threshold such that a short circuit to voltage 30 is reported by signal scv_x as an error, while only a disconnected load is present. This is an example for an adverse situation which may occur due to burst pulses.

To prevent or reduce such a behavior, in the embodiment of FIG. 3 a discharge circuit 310 is provided. Discharge circuit 310 comprises a burst detector 311 coupled with output 39 and configured to detect bursts on line 38. Burst detector 311 may, for example, be implemented as discussed above with reference to FIG. 2 or as will be discussed below with reference to FIG. 4. However, other implementations are also possible. When a burst is detected, a signal sact output by burst detector 311 causes a transistor 319 to close, i.e., become conducting between its source and drain terminals.

Additionally, burst discharge circuit may be enabled or disabled by a signal senable supplied to a gate terminal of a transistor 320. For example, burst discharge circuit 310 may be enabled by closing transistor 320 when power transistor 36 is inactive, i.e., open. For example, in cases where power transistor 36 is closed, output 39 is essentially at the voltage of voltage supply 30, i.e., VBB, such that in this situation the problem of a rising voltage due to burst pulses may not occur.

When a burst is detected by burst detector 311 such that transistor 319 is closed by signal sact and at the same time burst discharge circuit 310 is enabled by signal senable, a voltage on line 38 and at output 39, e.g., a voltage building up as described above, may be discharged via a resistor 312, a diode 313, a voltage source 314 and transistors 319, 320 to ground, thereby, e.g., preventing or mitigating a rise of voltage on line 38 due to burst pulses. Resistor 312 may serve as a protection and to limit the current. Diode 313 may prevent a reverse current flowing to output 39. Voltage source 314 may provide a defined voltage drop which may prevent a voltage at output 39 to fall below a predetermined voltage level. For example, voltage source 314 may be designed to prevent the voltage at output 39 below the above-explained second threshold of detection circuit 332. In this way, for example a disconnected load 340 may still be detected correctly, whereas a wrong indication of a short circuit to supply voltage 30 may be prevented in some embodiments.

Additionally, as shown in FIG. 3, a resistor 315, a capacitance 316 and/or a zene diode 317 may couple a gate terminal of transistor 319 with ground to ensure that transistor 319 is open as long as no signal sact is sent from burst detector 311. It should be noted that in some embodiments, only some of elements 315, 316, 317 may be provided. For example, in some embodiments only resistor 315 and zener diode 317 may be provided, without providing capacitance 316.

It should be noted that in some embodiments besides discharge circuit 310 additional measures to mitigate the effect of burst pulses may be provided. For example, in some embodiments a recharge unit 31 may be provided which is coupled between voltage supply 30 and a gate terminal of power transistor 36 and which may serve to compensate for a voltage drop at gate of power transistor 36 due to burst pulses before power transistor 36 closes.

In other embodiments, a series connection of a resistor 32 and a transistor 33 may be provided between gate and source of power transistor 35 in FIG. 3. In still other embodiments, no additional measures besides burst discharge circuit 310 or other measures involving a burst detector and a path between a line like 38 and a reference potential like ground may be taken.

In other embodiments, additionally or alternatively to closing the path from line 38 to ground, as indicated by an arrow 42 diagnostic circuit 332 may be controlled by a signal like signal sact in case a burst is detected. For example, diagnostic circuit 332 may be temporarily deactivated, filters like filters 334, 336 or 338 may be reset or frozen, freezing the filters meaning that the output of the filter remains constant during the burst. Through such measures, also a wrong diagnosis by diagnostic circuit 332 may be prevented in some embodiments.

In some embodiments, additionally a digital sensor or switch input 341, e.g., according to standard IEC 61131-2 may be coupled with output 39. A further external diagnosis device may be coupled to digital input 341. Burst discharge circuit 310 may also prevent a voltage at digital sensor or switch input 341 from rising above a predetermined value due to burst by discharging a voltage caused by the burst to ground as discussed above. For example, a voltage drop caused by voltage source 314 may also be selected based on specifications for digital input 341.

Figure 4:
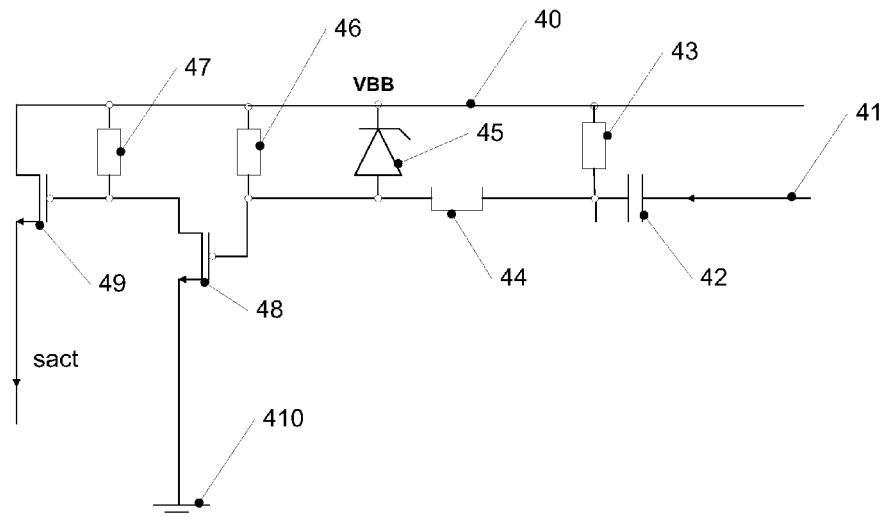
FIG. 4 is a circuit diagram illustrating a burst detector according to an embodiment.

In FIG. 4, a circuit diagram showing a possible implementation of a burst detector like burst detector 13 of FIG. 1 or burst detector 311 of FIG. 3 is illustrated.

In FIG. 4, 40 denotes a supply voltage, for example, VBB, and the burst detector is coupled with a line where bursts are to be detected at 41. For example, 41 may be coupled with output 39 of FIG. 3 in case the burst detector of FIG. 4 corresponds to burst detector 311 of FIG. 3.

The burst detector of FIG. 4 comprises a high-pass filter formed by a resistor 43 and a capacitor 42. For example, a resistance value of resistor 43 and a capacitance value of capacitor 42 may be selected such that the high-pass filter has a corner frequency of the order of 10 MHz, to be able to detect bursts with corresponding rise times, but to block other signals.

A resistor 44 serves for limiting the current caused by the pulse, and a zener diode 45 serves for limiting a voltage difference between supply voltage 40 and a gate terminal of a transistor 48. Therefore, resistor 44 and zener diode 45 serve as a limiter.

A transistor 48, a transistor 49 and pull-up resistors 46, 47 essentially form a Darlington stage for generating signal sact in response to the burst 410 denotes ground in FIG. 4. Therefore, transistors 48, 49 together with resistors 46 and 47 serve as signal generator to generate signal sact. Signal sact in turn may be used to close a path for discharging a voltage built up due to bursts, for example, as explained with reference to FIG. 1 or 3.

Figure 5:
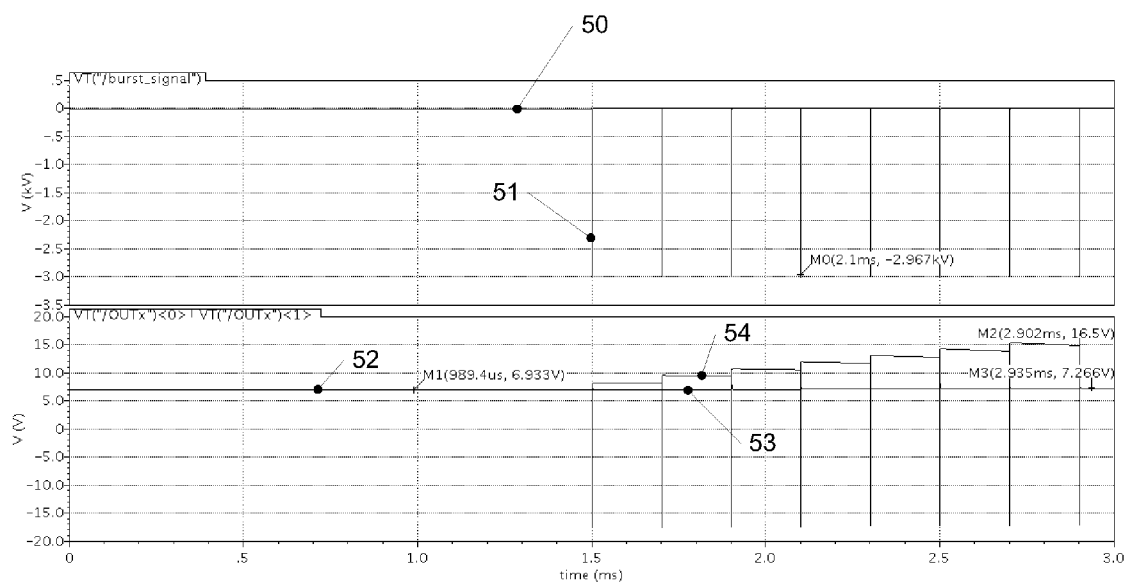
FIG. 5 shows simulation results for illustrating some features of some embodiments.

In FIG. 5, simulation results are shown for illustrating operation of the apparatus of FIG. 3 and the burst detector of FIG. 4. However, it should be noted that these simulation results, in particular any numerical values given in connection therewith, merely serve for further illustrating the functioning of some embodiments and are not to be construed as limiting in any way.

In an upper half of the graphs shown in FIG. 5, until a time of 1.5 ms in the scale of FIG. 5 as illustrated by a curve 50 no burst signals are applied. Following this, burst signals 51 are applied with a voltage of roughly −3000 kV at intervals of about 0.2 ms.

In the lower half, the voltage on a corresponding line 38 (which corresponds to a voltage at output 39) is shown. In a curve part 52 prior to the occurrence of bursts, the voltage is at 7 V which may, for example, correspond to a cable break or otherwise disconnected load. Curve 53 shows a case after the bursts occur with discharge circuit 310 of FIG. 3. Due to the functioning of discharge circuit 310, the voltage on the line essentially remains constant and only rises to 7.266 V at a point M3. In contrast, a curve 54 shows the behavior without such a discharge circuit. Here, with each burst the voltage on the line rises, reaching 16.5 V at a point M2 corresponding to a time of 2.9 ms. At such a voltage, for example diagnostic circuit 332 of FIG. 3 would wrongly indicate a short circuit to supply voltage 30, i.e., VBB. In contrast, with discharge circuit still the correct diagnosis, namely a disconnected load, would be given.

Therefore, in some embodiments using a discharge circuit as explained with respect to FIG. 1 or FIG. 3 a correct diagnosis can be ensured even when bursts occur.

In the embodiment of FIG. 3, only a so-called high-side driver in the form of power transistor device 35 is provided, i.e., output 39 is selectively connected to supply voltage 30. In other embodiments, other kinds of drivers may be provided. For example, in FIG. 6 an embodiment is shown where a so-called push-pull driver is provided.

Figure 6:
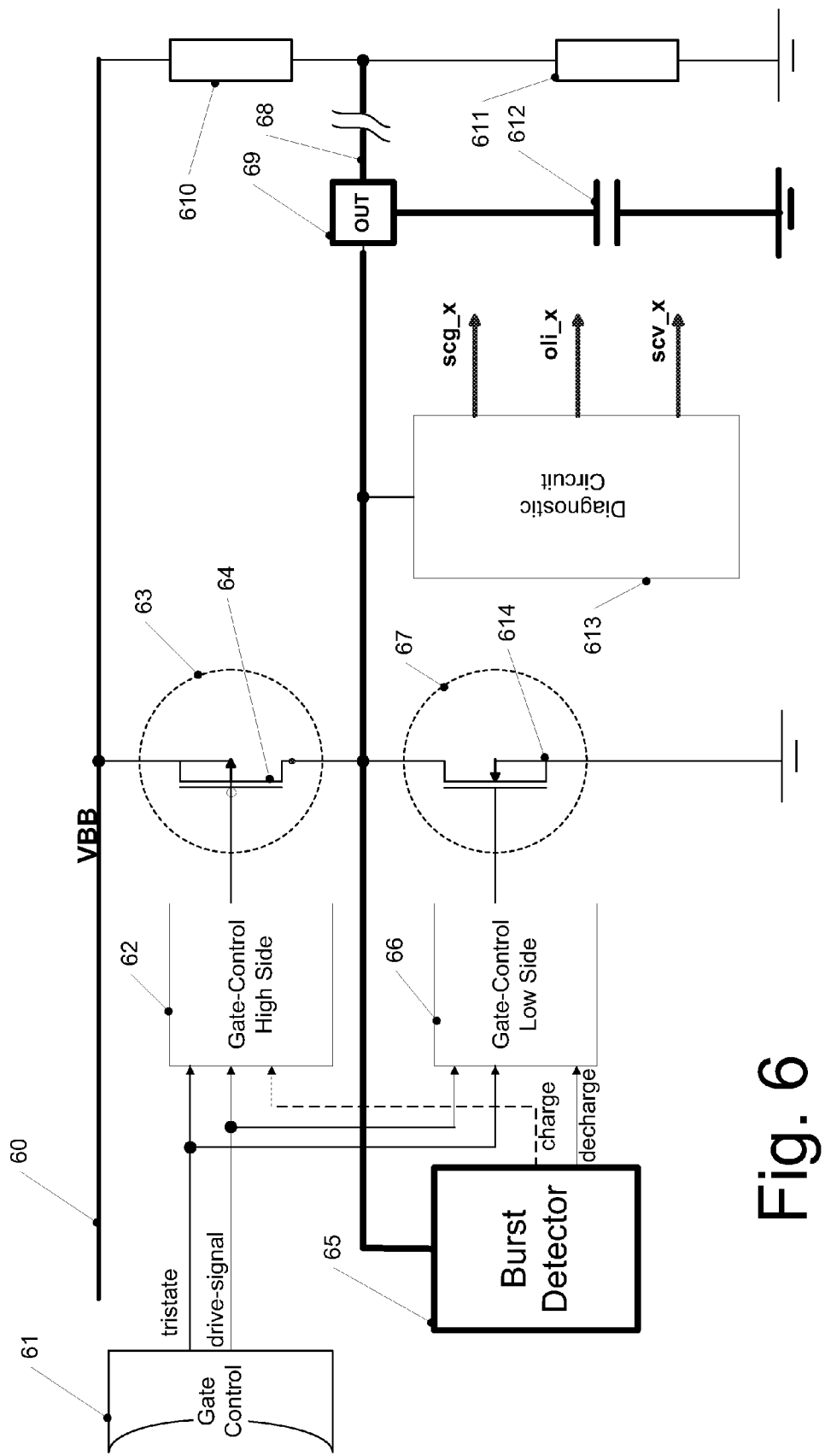
FIG. 6 is a circuit diagram illustrating an apparatus according to a further embodiment.

In FIG. 6, a further embodiment is shown in which a load 611 and/or a load 610 may be coupled with an output 69 of a control device via a single-ended line 68. Loads 610 and/or 611 again may represent remote devices, appliances or the like in an industrial environment, for example, a motor, a relay or any other appropriate device used in an industrial environment. Via a first power switch device 63 comprising a PMOS transistor 64, output 69 may be selectively coupled with a supply voltage 60, for example VBB. The coupling of output 69 with supply voltage 60 is also referred to as high-side connection in some circumstances. Furthermore, output 69 is coupled with ground via a power switch 67 comprising, in the example shown, an NMOS transistor 614. A gate control high-side device 62 controls a gate of PMOS transistor 64 in response to a tristate signal and/or a drive signal from a gate control device 61, and a gate control low-side device 66 controls a gate of NMOS transistor 614 in response to the tristate signal and/or drive signal. In other embodiments, gate control device 61 may directly control PMOS transistor 64 and NMOS transistor 614. Gate control device 61 may comprise any suitable circuitry for generating the desired signals, i.e., tristate and/or drive signal. For example, gate control device 61 may comprise control circuitry for controlling loads 610 and/or 611 via PMOS transistor 64 and NMOS transistor 614.

In response to the drive signal, one of PMOS transistor 64 and NMOS transistor 614 is closed, while the other one of PMOS transistor 64 and NMOS transistor 614 is open. When PMOS transistor 64 is closed, a voltage at output 69 is "pushed" to VBB. In case NMOS transistor 614 is closed, the voltage at output 69 is "pulled" to ground. Furthermore, in response to the tristate signal both PMOS transistor 64 and NMOS transistor 614 may be opened such that output 69 is decoupled from supply voltage 60 and ground.

Gate control high-side device 62 and Gate control low-side device 66 may, for example, comprise logic circuits for combining the tristate signal and the drive signal accordingly, and/or analog circuits for adjusting an operation point of PMOS transistor 64 or NMOS transistor 614, respectively, to a desired or correct operation point.

Furthermore, the apparatus shown in FIG. 6 comprises a capacitor 612 coupling output 69 with ground, similar to capacitor 339 of FIG. 3.

Furthermore, the apparatus of FIG. 6 comprises a diagnostic circuit 613 which may, for example, be implemented as has been described for diagnostic circuit 332 of FIG. 3.

In the tristate case, i.e., PMOS transistor 64 and NMOS transistor 614 both being open, and in case of a "broken load," for example, a broken line 68, negative burst pulses may have an effect as described above with reference to FIG. 3, i.e., PMOS transistor 64 may be inadvertently closed for a short period of time although it is nominally open, thus charging capacitor 612. This in turn may lead to a gradually increasing voltage at output 69, which in turn may lead to a wrong behavior of diagnostic circuit 613, for example, indicating a short-circuit to supply voltage 60 instead of a broken load condition, also referred to as open line condition.

To prevent such a behavior, in the embodiment of FIG. 6 a burst detector 65 is provided to detect bursts occurring on line 68 (and therefore also at output 69). Burst detector 65 may be implemented as described with reference to FIGS. 1-4 above. In response to a detected burst, burst detector 65 may control NMOS transistor 614 via gate control low-side device 66 using a signal decharge to temporarily close, and therefore discharge the built-up voltage to ground. In other words, as in the embodiment of FIG. 6 NMOS transistor 614 is already provided, a separate discharge path as in FIG. 3 (path comprising resistor 312, diode 313, voltage source 314 and transistors 319, 320) is not necessary, and NMOS transistor 614 may be used both as driver switch, in this case driver transistor, in a driver mode of operation and as switch of a discharge path. However, in other embodiments an additional discharge path like the one in FIG. 3 may be provided.

Additionally, in the embodiment of FIG. 6 positive burst pulses may lead to NMOS transistor 614 inadvertently closing, therefore decreasing a voltage on line 68 and at output 69, which may also be undesirable and which may, for example, lead to an indication of a short-circuit to ground inadvertently output by diagnostic circuit 613. To prevent such a behavior, in some embodiments burst detector 65 optionally may also detect positive pulses and, in case of a detection of a positive pulse, may control PMOS transistor 64 via gate control high-side device 62 to temporarily close using a signal charge, to such charge output 69 and line 68 to at least partially compensate the effect of the pulses.

In other embodiments, only the decharge functionality or only the charge functionality may be provided. Furthermore, in some embodiments the detection of pulses by burst detector 65 and/or the control of PMOS transistor 64 or NMOS transistor 614 via the signal charge and decharge may only be activated when PMOS transistor 64 and NMOS transistor 614 are both open, i.e., non-conducting, which corresponds to a tristate of the apparatus.

It should also be noted that while not shown in FIG. 6, also in the embodiment of FIG. 6 additional measures against burst pulses as explained with reference to FIG. 3, for example, a recharge unit like recharge unit 31 may be provided.

Figure 7:
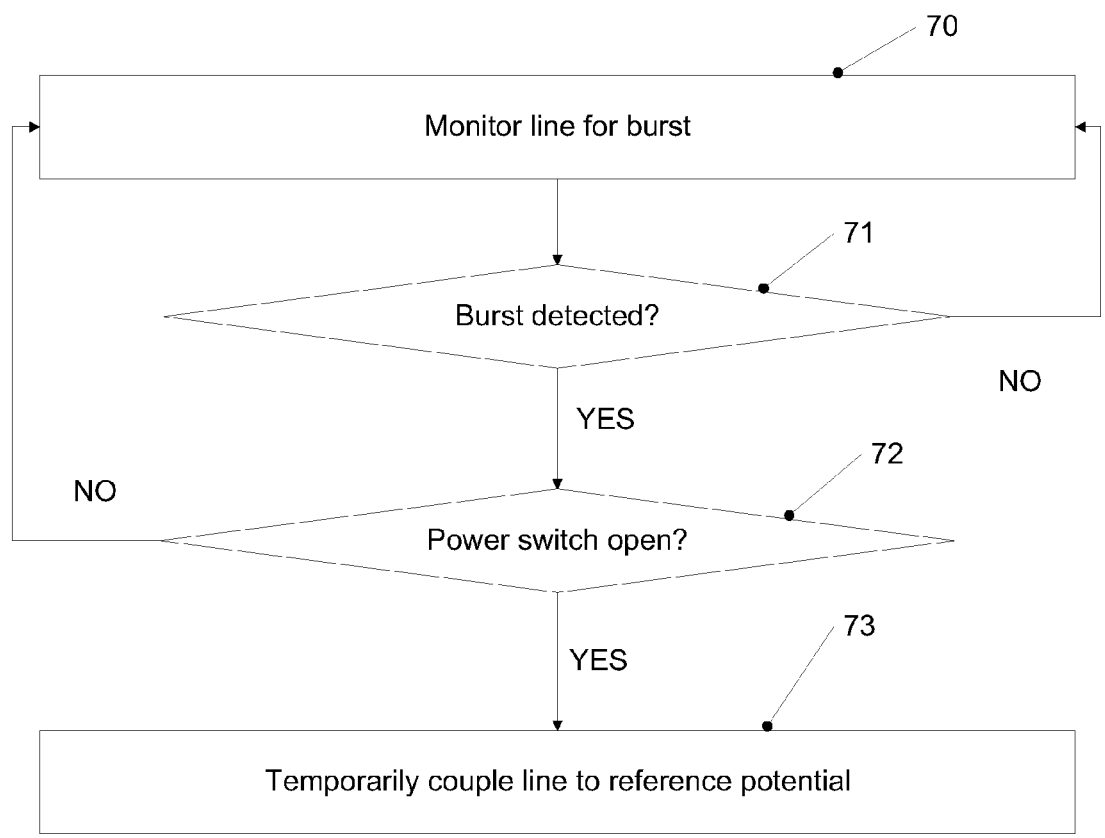
FIG. 7 is a flowchart illustrating a method according to an embodiment.

In FIG. 7, a flowchart illustrating a method according to an embodiment is shown. The method shown in FIG. 7 may be implemented using an apparatus as discussed with reference to FIGS. 1-6, but may also be implemented in other apparatuses and devices. Merely for illustration purposes, when discussing the method of FIG. 7 reference will be made to the apparatuses previously discussed with reference to FIGS. 1-6.

At 70, a line is monitored for occurrence of a burst, for example, line 11 of FIGS. 1 and 2, line 38 of FIG. 3 or line 68 of FIG. 6. For monitoring the line for a burst, in some embodiments a burst detector as previously discussed may be used. At 71, as long as no burst is detected during the monitoring (NO at 71), the monitoring at 70 continues. When a burst is detected (YES at 71), and a power switch (for example, PMOS transistor 34 of FIG. 3 or transistors 64, 614 of FIG. 6) is open (YES at 72), the line is temporarily coupled to a reference potential. In case the power switch is closed (NO at 72) the monitoring continues at 70.

In some embodiments, whether the power switch is open or not may be indicated by a signal, like signal senable of FIG. 3 or signal tristate of FIG. 6.

As explained the temporary coupling of the line to the reference potential at 73 at least does not primarily serve to deviate the burst to the reference potential, but rather to compensate for effects of the burst on parts of the circuit involved. For example, in the embodiments of FIGS. 3 and 6, as explained a burst may temporarily open a transistor coupling the line with a supply voltage, thus charging the line, and temporarily coupling the line to a reference potential may for example then couple the line to ground to discharge the line again.

As mentioned, the above-described embodiments serve illustrative purposes only, and are not to be construed as limiting the scope of the present application in any way.

What is claimed is:

1. An apparatus, comprising:
   an output to be coupled with a remote device via a line in an industrial environment;
   a control device coupled with said output and being configured to control said remote device via said line;
   a burst detector coupled with said output to detect bursts on said line; and
   a switch device to couple said output with a reference potential in response to a burst being detected by said burst detector.

2. The apparatus of claim 1, wherein said output is a single-ended output.

3. The apparatus of claim 1, wherein said control device comprises a power switch to selectively couple said output with a supply voltage.

4. The apparatus of claim 3, wherein said switch device is configured to couple said output with said reference potential in response to a burst being detected only when said power switch is nominally open.

5. The apparatus of claim 4, wherein the switch device is configured to couple the line to the reference potential in response to the burst to compensate for a charging of the line due to an inadvertent closing of the power switch by the burst.

6. The apparatus of claim 1, further comprising a diagnostic circuit coupled to said output, wherein said switch device is configured to couple said output to said reference potential in response to a burst to prevent a wrong diagnosis of a line condition by the diagnostic circuit due to the burst.

7. The apparatus of claim 1, wherein said burst detector comprises a high-pass filter coupled with said output, a limiter coupled with said high-pass filter and a signal generator coupled with said limiter, the signal generator being configured to generate a control signal for said switch device.

8. The apparatus of claim 1, wherein the switch device additionally serves as driver switch in a driver mode of operation.

9. An apparatus, comprising:
   a single-ended output to be coupled with a remote device via a line;
   a power switch coupled between said output and a supply voltage;
   a burst detector coupled with said output; and
   a discharge path coupled between said output and a reference potential, said discharge path comprising a switch element controlled by said burst detector.

10. The apparatus of claim 9, wherein said reference potential is ground, and wherein said burst detector is responsive to negative burst pulses.

11. The apparatus of claim 9, wherein said discharge path further comprises a further switch element to receive an enable signal when said power switch is nominally open.

12. The apparatus of claim 9, wherein said discharge path comprises a voltage source.

13. The apparatus of claim 9, wherein said switching element comprises a further power switch, and wherein said apparatus comprises a control circuit to control said power switch and said further power switch.

14. The apparatus of claim 9, wherein said switching element comprises a transistor, wherein a gate terminal of said transistor is coupled with an output of said burst detector, wherein said gate terminal is further coupled with said reference potential via at least one of a resistor, a capacitor or a diode.

15. The apparatus of claim 9, wherein said burst detector comprises a high-pass filter, said high-pass filter comprising a capacitor and a resistor, and a Darlington stage, an output of said Darlington stage being coupled with an input of said switching element.

16. The apparatus of claim 15, wherein said burst detector further comprises a resistor as a current limiter and a diode as a voltage limiter.

17. A system, comprising:
    a control device coupled with a line;
    a remote device coupled with said line;
    a burst detector coupled with said line to detect bursts on said line; and
    a switch device to couple said line with a reference potential in response to a burst being detected by said burst detector.

18. The system of claim 17, wherein a length of the line is at least one meter.

19. The system of claim 17, wherein said remote device comprises an industrial device.

20. The system of claim 17, wherein said control device comprises a power switch to selectively control a supply of power to said remote device, and wherein said switch device is configured to couple said line with said reference potential in response to a burst only when said power switch is nominally open.

21. A method, comprising:
    monitoring a line in an industrial environment for a burst; and
    temporarily coupling the line to a reference potential in response to detecting the burst,
    wherein temporarily coupling comprises temporarily coupling the line to the reference potential only if a power switch coupling the line with a supply voltage is open, and
    wherein temporarily coupling at least partially compensates a charging of the line due to an inadvertent opening of the power switch by the burst.

22. The method of claim 21, wherein detecting the burst comprises high-pass filtering a signal on the line, limiting the high-pass filtered signal and controlling a switching element coupled between the line and the reference potential based on the limited high-pass filtered signal.

* * * * *